United States Patent
Zhao et al.

(10) Patent No.: US 7,098,755 B2
(45) Date of Patent: Aug. 29, 2006

(54) HIGH POWER, HIGH LINEARITY AND LOW INSERTION LOSS SINGLE POLE DOUBLE THROW TRANSMITTER/RECEIVER SWITCH

(75) Inventors: Yibing Zhao, Newton, MA (US); Shuyun Zhang, Allston, MA (US); Robert J. McMorrow, Concord, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/620,395

(22) Filed: Jul. 16, 2003

(65) Prior Publication Data
US 2005/0014473 A1 Jan. 20, 2005

(51) Int. Cl.
*H01P 1/10* (2006.01)
(52) U.S. Cl. .................. 333/101; 333/104; 333/162
(58) Field of Classification Search ........ 333/101–104, 333/262, 162; 327/408, 416, 427, 436
See application file for complete search history.

(56) References Cited

U.S. PATENT DOCUMENTS

| | | | |
|---|---|---|---|
| 4,803,447 A | 2/1989 | Schultz et al. | |
| 4,890,077 A * | 12/1989 | Sun | 333/81 A |
| 4,979,232 A | 12/1990 | Martz et al. | |
| 5,475,875 A | 12/1995 | Katsuyama et al. | |
| 5,514,992 A * | 5/1996 | Tanaka et al. | 327/317 |
| 5,594,394 A | 1/1997 | Sasaki et al. | |
| 5,748,053 A * | 5/1998 | Kameyama et al. | 333/103 |
| 6,373,291 B1 * | 4/2002 | Hamada et al. | 326/113 |
| 6,768,338 B1 * | 7/2004 | Young et al. | 326/44 |
| 2001/0040479 A1 | 11/2001 | Zhang | |
| 2002/0177417 A1 | 11/2002 | Visser | |
| 2003/0171098 A1 | 9/2003 | Tai et al. | |

FOREIGN PATENT DOCUMENTS

EP 0766396 4/1997

(Continued)

OTHER PUBLICATIONS

"Voltage-Tolerant Monolithic L-Band GaAs SPDT Switch," Cooper et al., *IEEE MTT-S Digest* (1989), no month.

(Continued)

*Primary Examiner*—Anh Q. Tran
(74) *Attorney, Agent, or Firm*—Gauthier & Connors LLP

(57) ABSTRACT

A high performance single-pole-double-throw (SPDT) Transmitter/Receiver (T/R) FET switch utilizes a plurality of multi-gate FETs in series to realize low insertion loss, low harmonic distortion and high power handling capabilities. The SPDT switch consists of an antenna port, a transmitter branch coupled to a transmitter port through a plurality of multi-gate FETs in series and a receiver branch coupled to a receiver port through a plurality of multi-gate FETs in series. When a high power signal passes from the transmitter port to the antenna port through the transmitter branch, the receiver branch is required to be shut off electrically to prevent the high power signal from leaking to receiver port. This leakage can degrade the isolation of the switch and cause harmonic distortion. Furthermore, the transmitter branch is required to provide a resistance as small as possible to reduce the power loss when it passes through the transmitter branch to the antenna port. In the receiver branch, two of the gate metals in the multi-gate FETs are fabricated with gate sizes several times larger than the others. Furthermore, a heavily doped cap layer is utilized between the gate fingers in a multi-gate FET to reduce the channel resistance of FET, thereby lowering the insertion loss.

32 Claims, 15 Drawing Sheets

FOREIGN PATENT DOCUMENTS

| | | |
|---|---|---|
| EP | 0 700 161 A2 | 3/1999 |
| JP | 09238059 | 9/1997 |
| WO | WO 01/67602 | 9/2001 |
| WO | WO 02/067451 | 8/2002 |

OTHER PUBLICATIONS

"A Dual-Gate Shorted-Anode Silicon-on-Insulator Lateral Insulated Gate Bipolar Transistor with Floating Ohmic Contact for Suppressing Snapback and Fast Switching Characteristics," Oh et al., *Microelectronics Journal 30* pp. 577-581 (1999), no month.

"High-Performance GaAs Switch IC's Fabricated Using MESFET's with Two Kinds of Pinch-Off Voltages and a Symmetrical Pattern Configuration," Uda et al. *IEEE Journal of Solid-State Circuits*. Oct. 1994. vol. 29, No. 10.

"A Low-Voltage, High-Power T/R-Switch MMIC Using LC Resonators," Tokumitsu et al. *IEEE Transactions on Microwave Theory and Techniques*. May 1995. vol. 43, No. 5.

"A GaAs High-Power RF Single-Pole Double-Throw Switch IC for Digital Mobile Communication System," Miyatsuji et al. *IEEE International Solid-State Circuit Conference*. 1994, no month.

"Novel High Performance SPDT Power Switches Using Multi-Gate FET's," McGrath et al. *IEEE MTT-S Digest*. 1991, no month.

"A 3V MMIC hip Set for 1.9GHz Mobile Communications Systems," Tanaka et al. *IEEE International Solid-State Circuits Conference*. 1995, no month.

"A High Power 2-18 GHz T/R Switch," Schindler et al. *IEEE MTT-S Digest*. 1990, no month.

\* cited by examiner

HIGH POWER, HIGH LINEARITY AND LOW INSERTION LOSS SINGLE POLE DOUBLE THROW TRANSMITTER/RECEIVER SWITCH

FIELD OF THE PRESENT INVENTION

The present invention relates to high frequency semiconductor switches used for wireless communication systems, and more particularly, to high-electron-mobility-transistor ("HEMT") switches to meet the criteria of high power, low insertion loss, and low distortion performance.

BACKGROUND OF THE PRESENT INVENTION

In conventional mobile wireless communication systems, especially Global System for Mobile Communications ("GSM") cellular handsets, the transmit/receive ("T/R") switch applied to the antenna end is capable of handling a high power signal of up to 35 dBm along with low harmonic distortion and low signal loss. The conventional mobile wireless communication systems further use a control voltage to actuate the switching wherein the control voltage is limited by the handset battery voltage, which in most conventional situations is about 3 volts and, in some cases, even less.

FIG. 1 illustrates a schematic diagram of a conventional single pole double throw ("SPDT") field effect transistor ("FET") switch for a receiver port 2 and a transmitter port 3 connected to an antenna port 1. When the control voltage $V_{cont1}$ for a receiver port 8, the receiver channel 8 providing the communication channel between the receiver port 2 and the antenna port 1, is 0.0 volts and the $V_{cont2}$ for a transmitter port 3, the transmitter channel 9 providing the communication channel between the transmitter port 3 and the antenna port 1, is 3.0 volts, the FET 5 of the receiver channel 8 is in an OFF state because the voltage drop between the gate G1 and the source S1 of FET 5 ($V_{G1S1}=V_{G1}-V_{S1}$) in the FET 5 or the voltage drop between the gate G1 and the drain D1 of FET 5 ($V_{G1D1}=V_{G1}-D_1$) in the FET 5 is below FET pinch-off voltage, $V_P$.

While the FET 5 of the receiver channel 8 is in an OFF state, FET 4 of the transmitter channel 9 is in an ON state because the voltage drop between the gate G2 and the source S2 of FET 4 ($V_{G2S2}=V_{G2}-V_{S2}$) in the FET 4 or the voltage drop between the gate G2 and the source D2 of FET 4 ($V_{G2D2}=V_{G2}-V_{D2}$) in the FET 4 is above $V_P$ of FET 4.

When a high power RF signal passes through the ON-state FET 4 of the transmitter channel 9 to antenna port 1, it is also applied to the OFF-state FET 5 of the receiver channel 8 at the antenna port 1 as well. Due to extremely low resistance loss in FET 4, FET 4 remains in the ON state no matter how high a power is applied. Essentially, the power loss and generation of distortion are related to the change in operational status of FET 5. This can be verified through the simulation of the simplified small-signal equivalent circuit model of FET 5, as shown in FIG. 2.

Assuming that the RF signal is $v=V_{rf}\mathrm{Sin}(\omega t)$, the voltage drop at each junction of FET 5 is expressed as below:

$$V_{G1S1}=V_{GS}(DC)+(C_{GD1}/(C_{GD1}+C_{GS1}))v \quad (1)$$

$$V_{G1D1}=V_{GD}(DC)-(C_{GS1}/(C_{GS1}+C_{GD1}))v \quad (2)$$

where $V_{GS}(DC)$ and $V_{GD}(DC)$ are DC voltage drops in each junction in FET 5, respectively. Normally, $V_{GD}(DC)=V_{GS}(DC)$ $V_{cont1}-V_{cont2}=-3V$; $C_{GS1}=C_{GD1}$ in a symmetrically designed FET 5; $V_{rf}=17.8$ V for a 35 dBm RF signal, and $V_P=-1.0$ V which is a conventional pinch-off value in a HEMT design, then $$V_{G1S1}=-3+8.9\cdot\mathrm{Sin}(\omega t) \quad (3)$$

$$V_{G1D1}=-3-8.9\cdot\mathrm{Sin}(\omega t) \quad (4)$$

From Equations (3) and (4), it can be seen that $V_{G1S1}$ is greater than $V_P$, in a certain time period when v is in the positive half cycle, and $V_{G1D1}$ is greater than $V_P$, in a certain time period when v is in the negative half cycle. Therefore, FET 5 is not able to remain in the OFF state at all times, causing power loss and harmonic distortion.

The capability of power handling in a single FET switch can be estimated based on the drain current vs. gate-source voltage curve as illustrated in FIG. 3. The maximum power transfer without distortion is achieved by keeping FET 5 in OFF state. Hence, $$V_{rf\,max}=|V_{cont1}-V_{cont2}-V_P|\cdot((C_{GS1}+C_{GD1})/C_{GD1}) \quad (5)$$

So, the maximum power, $P_{rf\,max}$, is obtained as demonstrated by Equation (6) below.

$$P_{rf\,max}=(1/2Z_0)((C_{GS1}+C_{GD1})/C_{GD1})^2(V_{cont1}-V_{cont2}-V_P)^2 \quad (6)$$

where $Z_0$ is the system impedance, normally equal to 50 Ω. In a symmetric FET switch, $P_{rfmax}$ is calculated to be 22 dBm, which is much less than the specification for SPDT switches used in conventional cellular handset applications.

As seen from Equation (6), the lowering of the pinch-off voltage and/or the increasing of the control voltage can effectively improve power-handling capability and suppress harmonic distortion. However, the battery used in conventional cellular handset applications, as mentioned above, limits the control voltage. Moreover, the ON-state FET resistance $R_{on}$ restricts $V_P$. In other words, if the $V_P$ is lower, the insertion loss increases. Therefore, the lowering of the pinch-off voltage approach or the increasing of the control voltage approach are not viable candidates to effectively improve power-handling capability and suppress harmonic distortion due to the above-noted constraints.

Another conventional approach to increase power-handling capability is to use a plurality of FETs in series to replace single FET SPDT switches as shown in FIG. 4. As illustrated in FIG. 4, an antenna port 1 is connected to a receiver port 2 and a transmitter port 3 through a receiver channel 6 and a transmitter channel 7, respectively.

The receiver channel 6 includes three in series FETs (61, 62, and 63), each being connected to a control voltage source $V_{cont1}$. FET 61 has a source S1 (which is connected to the receiver port 2), a gate G1, and a drain D1. FET 62 has a source S2 (which is connected to the drain D1 of FET 61), a gate G2, and a drain D2. FET 63 has a source S3 (which is connected to the drain D2 of FET 62), a gate G3, and a drain D3 (which is connected to antenna port 1).

Likewise, the transmitter channel 7 includes three in series FET (71, 72, and 73), each being connected to a control voltage source $V_{cont2}$. FET 73 has a source S6 (which is connected to the transmitter port 3), a gate G6, and a drain D6. FET 72 has a source S5 (which is connected to the drain D6 of FET 73), a gate G5, and a drain D5. FET 71 has a source S4 (which is connected to the drain D5 of FET 72), a gate G4, and a drain D4 (which is connected to antenna port 1).

As explained above, the maximum transmit power with extremely low harmonic distortion can be derived based on the small signal equivalent circuit in FIG. 5.

$$P_{RFmax} = (9/2Z_0)((C_{GS1}+C_{GD1})/C_{GD1})^2(V_{cont1}-V_{cont2}-V_P)^2 \quad (7)$$

where, assuming all three FETs are identical; i.e., $C_{GS1}=C_{GS2}=C_{GS3}=C_{GS}$ and $C_{GD1}=C_{GD2}=C_{GD3}=C_{GD}$. Taking the parameters for a single FET, the maximum power $P_{RFmax}$ without distortion in three-FET switch can be calculated as 31.5 dBm according to Equation (7). Compared to the 22 dBm of $P_{RFmax}$ in the single FET switch analysis above, it clearly indicates that more FETs in series can improve power-handling capability of the switch. Thus, the $P_{RFmax}$ for "n" FETs in series can be easily deduced from Equation (7) as follows:

$$P_{RFmax} = (n^2/2Z_0)((C_{GS1}+C_{GD1})/C_{GD1})^2(V_{cont1}-V_{cont2}-V_P)^2 \quad (8)$$

The correlation of switch insertion loss in the transmitter branch and FET characteristics is written below.

$$IL = 20 \log(1+(R_{on}/2Z_0)) \quad (9)$$

$$R_{on} = nL_G/(W_G(V_{cont1}-V_{cont2}-V_P)) \quad (10)$$

where IL is the insertion loss in dB, $R_{on}$ is the total resistance of ON-state FETs in the transmitter branch, $W_G$ is the gate width of each FET, and $L_G$ is the gate length of each FET.

Equations (8) to (10) indicate that in a traditional SPDT switch, an increase of the number of FETs in series enhances the power handling capability and reduces signal distortion. On the other hand, the more FETs in series leads to a higher insertion loss. In addition, the increase of insertion loss caused by the reduction of $V_P$, as mentioned above, is confirmed through the correlation of $R_{on}$ and $V_P$, in Equation (10).

Therefore, it is desirable to provide a SPDT switch with improved power-handling capability, low harmonic distortion, and low insertion loss that is not limited by the voltage of the battery being used in the cellular handset application, the pinch-off voltage of the FET used in the SPDT switch or the number of FETs in series in the SPDT switch.

SUMMARY OF THE PRESENT INVENTION

A first aspect of the present invention is directed to a switch. The switch includes a plurality of field effect transistors connected in series, each field effect transistor including a gate, a source, and a drain. The gate of one of the series connected field effect transistors is a different size from the gate of another series connected field effect transistor.

A second aspect of the present invention is a switch. The switch includes a plurality of dual-gate field effect transistors connected in series, each dual-gate field effect transistor including two gates, a source, and a drain. One of the series connected dual-gate field effect transistors has a modified gate therein that is of a different size from gates of other series connected dual-gate field effect transistors.

A third aspect of the present invention is a high-electron-mobility-transistor. The high-electron-mobility-transistor includes two gate fingers; a transistor connection segment between the gate fingers; and a heavily doped cap layer fabricated upon the transistor connection segment between the gate fingers.

A fourth aspect of the present invention is a radio frequency single pole double throw switch. The radio frequency single pole double throw switch includes a receiver port; a transmitter port; an antenna port; a receiver section connecting the receiver port to the antenna; and a transmitter section connecting the transmitter port to the antenna. The receiver section includes a plurality of dual-gate field effect transistors connected in series, each dual-gate field effect transistor including two gates, a source, and a drain such that one of the series connected dual-gate field effect transistors has a modified gate therein that is of a different size from gates of other series connected dual-gate field effect transistors.

A fifth aspect of the present invention is a radio frequency single pole double throw switch. The radio frequency single pole double throw switch includes a receiver port; a transmitter port; an antenna port; a receiver section connecting the receiver port to the antenna; and a transmitter section connecting the transmitter port to the antenna. The receiver section includes a plurality of field effect transistors connected in series, each field effect transistor including a gate, a source, and a drain such that one of the series connected field effect transistors has a modified gate therein that is a different size from the gate of another series connected field effect transistor.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein.

DETAILED DESCRIPTION OF THE PRESENT INVENTION

Figure 1:
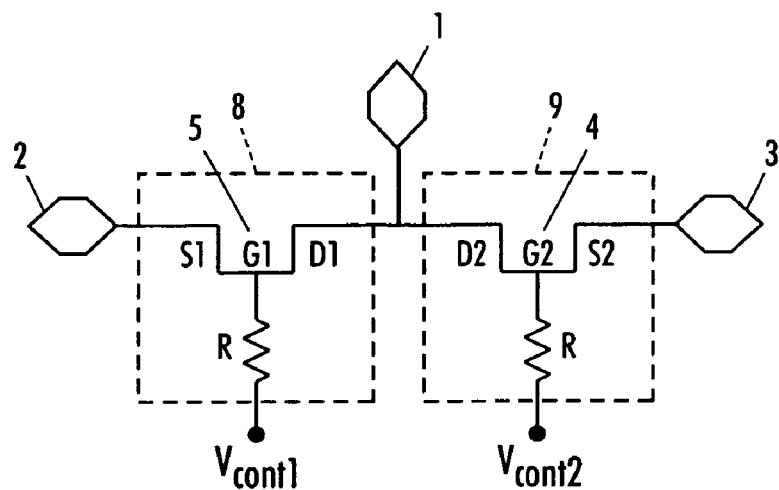
FIG. 1 is a schematic diagram of a conventional single FET SPDT T/R switch.
Figure 2:
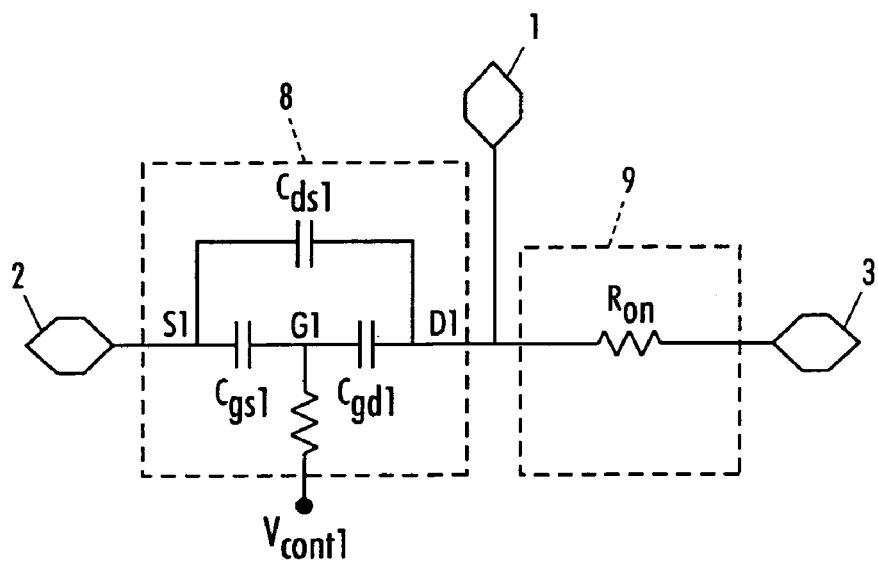
FIG. 2 is a diagram of simplified small signal equivalent circuit model for the SPDT switch structure of FIG. 1.
Figure 3:
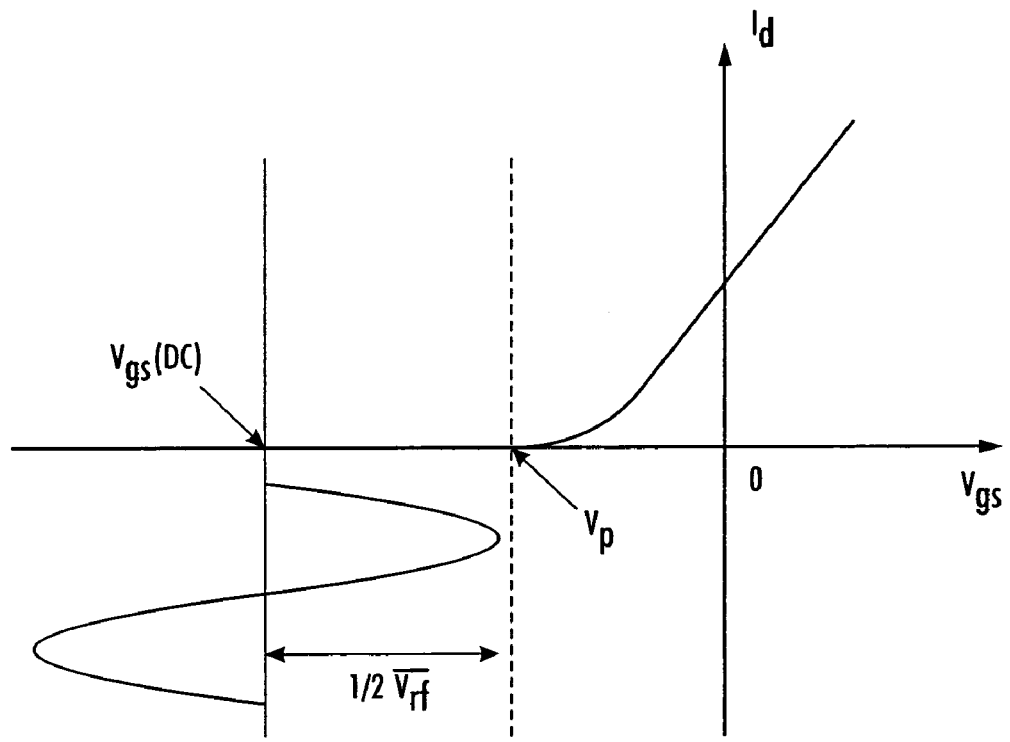
FIG. 3 is a drain current vs. gate voltage curve and the swing level of the input RF signal in the receiver FET structure of FIG. 1.
Figure 4:
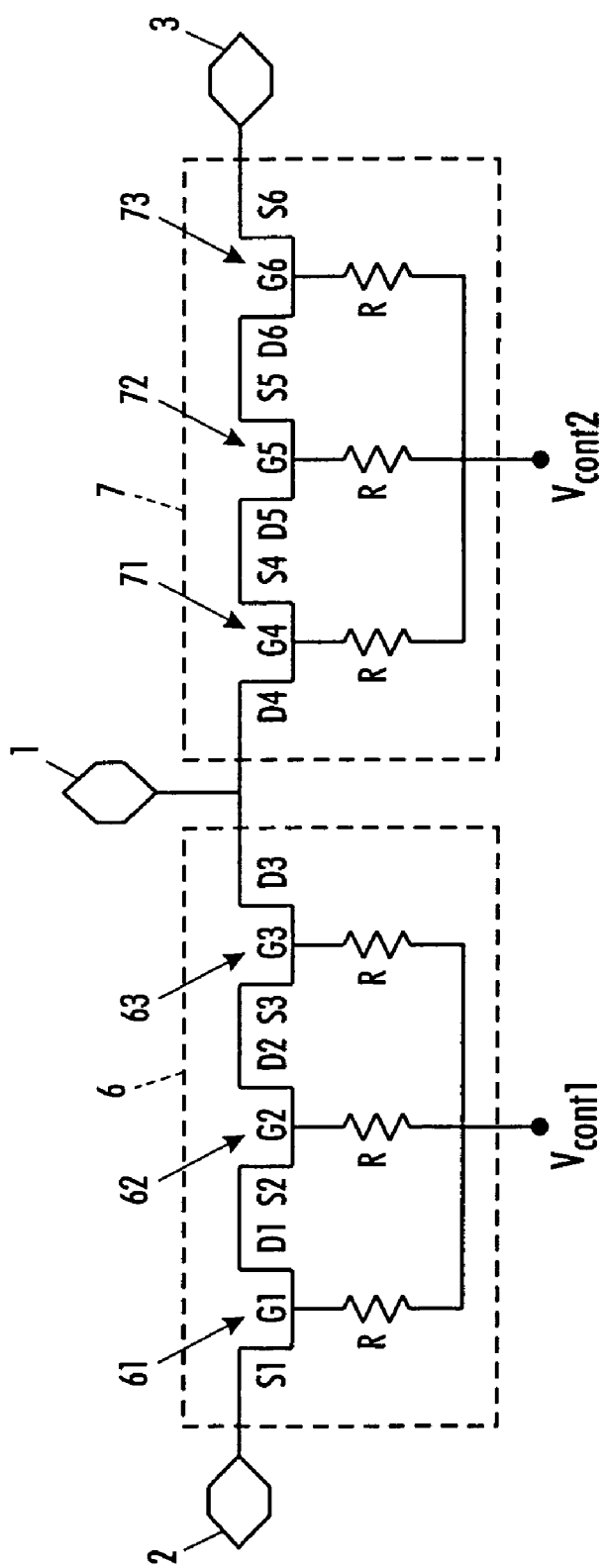
FIG. 4 is a schematic diagram of a conventional three FET SPDT T/R switch.
Figure 5:
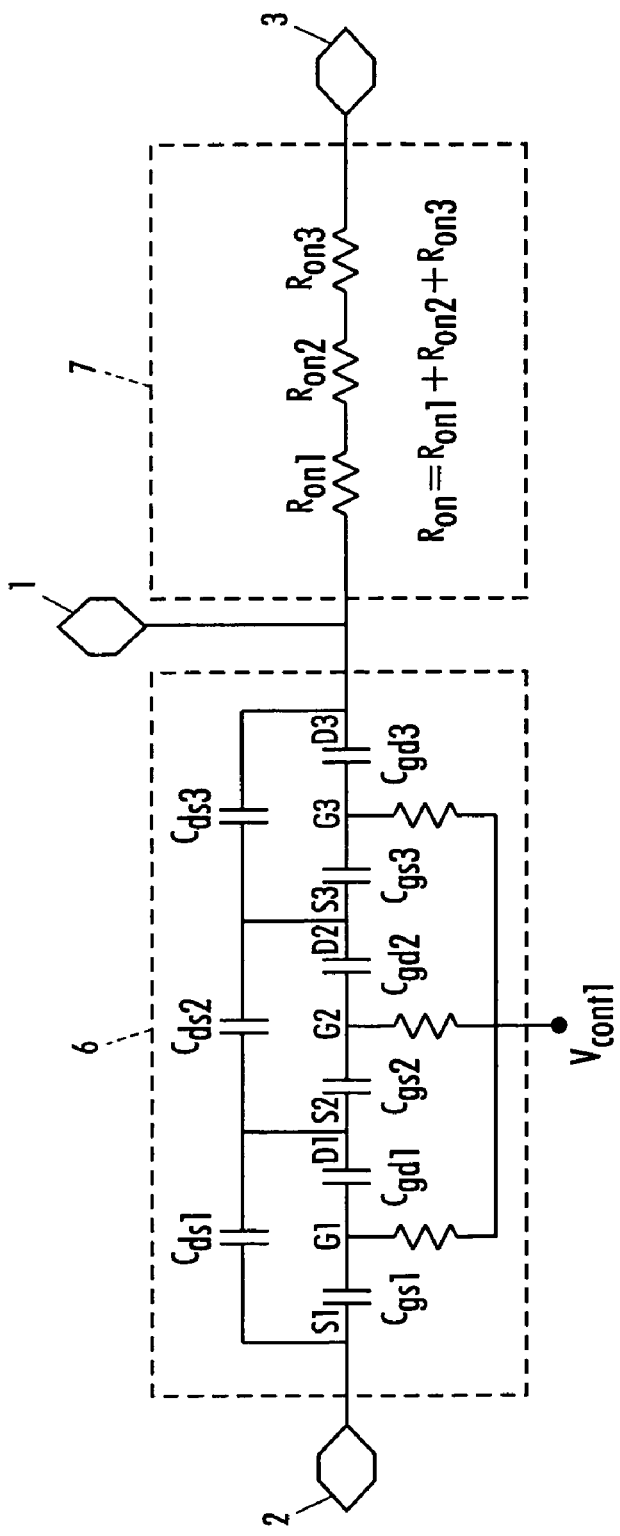
FIG. 5 is a diagram of simplified small signal equivalent circuit model for the OFF-state FETs in the conventional three FET structure of FIG. 4.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference numbering has been used throughout to designate identical or equivalent elements. It is also noted that the various drawings illustrating the present invention are not drawn to scale and that certain regions have been purposely drawn disproportionately so that the features and concepts of the present invention could be properly illustrated.

Figure 16:
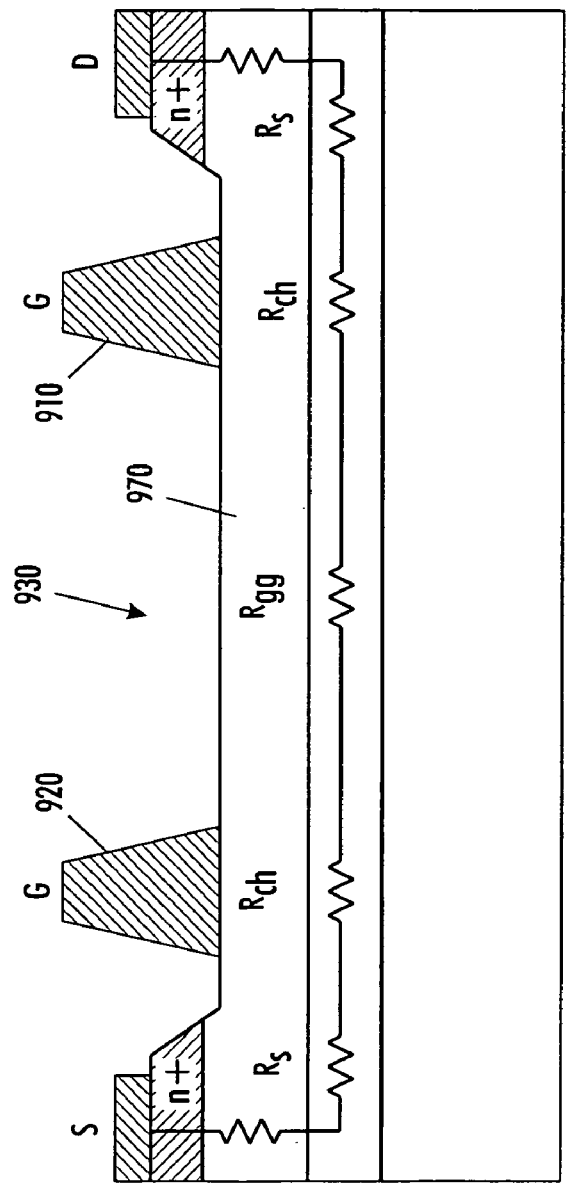
FIG. 16 is a diagram of cross-section of a conventional dual-gate HEMT.

As will be described below, the transmitter-receiver (T/R) switch of the present invention can be constructed of field effect transistors, such as MOSFET, MESFET, or pHEMT. In a preferred embodiment of the present invention, the transmitter-receiver (T/R) switch of the present invention is constructed using a plurality of HEMTs. An example of a conventional HEMT is illustrated in FIG. 16. Moreover, the T/R switch of the present invention utilizes three series dual-gate FETs. An example of such a T/R switch having three series dual-gate FETs is illustrated in FIG. 6.

Figure 6:
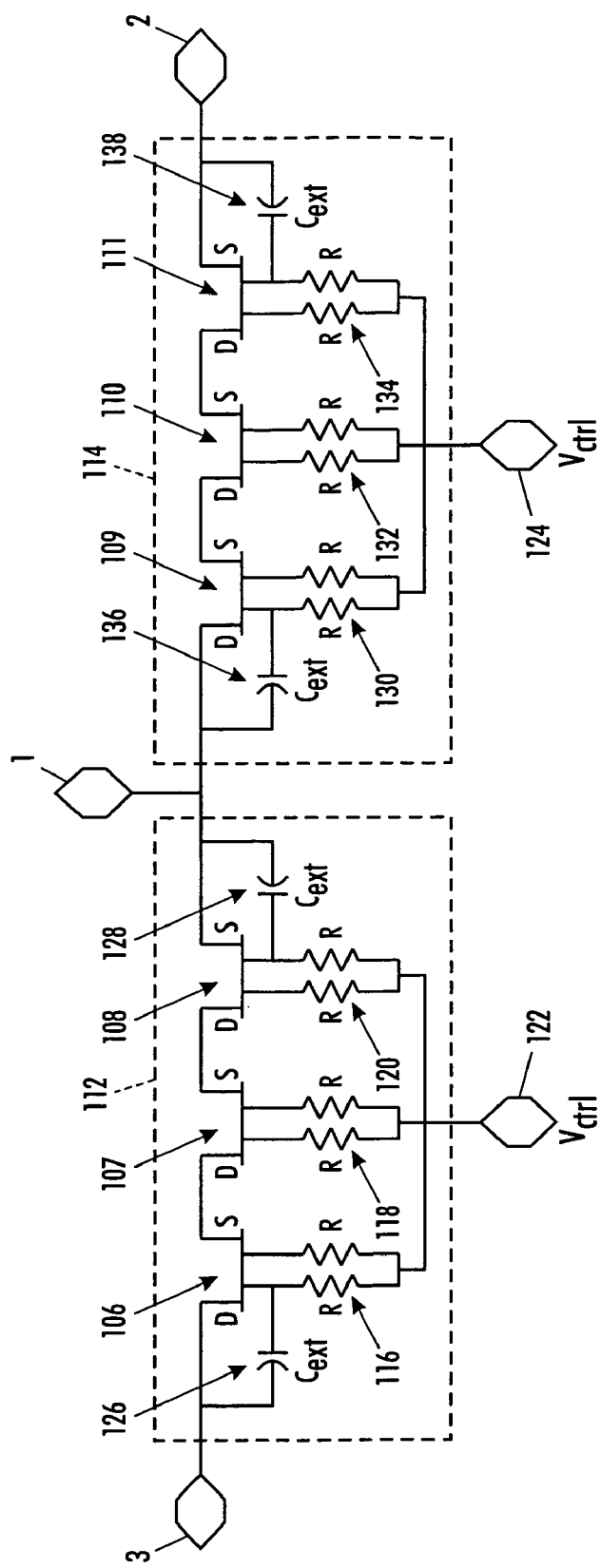
FIG. 6 illustrates a FET SPDT that includes additional capacitance between the gate and the drains or sources of the FETs.

FIG. 6 illustrates a dual-gate FET SPDT. The SPDT is divided in two sections, the transmitter channel 112 that is connected between a transmitter port 3 and an antenna port 1 antenna and a receiver channel 114 that is connected between a receiver port 2 and an antenna port 1.

The transmitter section 112 includes FETs 106, 107, and 108, wherein each of these FETs are dual-gate FETs having at least two gates in a preferred embodiment. The drain of the FET 106 is connected to the transmitter 3. The dual-gates of the FET 106 are connected to a first set of resistors 116, each of the resistors of the first set 116 having a resistance of R and being connected to a first DC voltage control source 122. The source of the FET 106 is connected to the drain of FET 107, and the gates of FET 107 are connected to a second set 118 of resistors, each of the resistors having a resistance of R and being connected to the DC voltage control source 122. The source of the FET 107 is connected to the drain of FET 108, and the gates of FET 108 are connected to a third set of resistors 120, each of the resistors having a resistance of R and being connected to the voltage control source 122. The source of the FET 108 is connected to the antenna port 1.

As illustrated in FIG. 6, a first end of an external capacitor 126 is connected to the transmitter port 3, and a second end of external capacitor 126 is connected to one of the resistors of the first set of resistors 116. Also, a first end of an external capacitor 128 is connected to the antenna port 1, and a second end of external capacitor 128 is connected to one of the resistors of the third set of resistors 120.

The receiver section 114 of the illustrated SPDT includes FETs 109, 110, and 111. The drain of the FET 109 is connected to the antenna port 1, and the gate of the FET 109 is connected to a fourth set of resistors 130, each of the resistors having a value of R and being a second DC voltage control source 124. The source of the FET 109 is connected to the drain of the FET 110, and the gates of the FET 110 are connected to a fifth set of resistors 132, each resistor having a value of R and being a second DC voltage control source 124. The source of the FET 110 is connected to drain of FET 111. The gates of FET 111 are connected to a sixth set of resistors 134, each resistor having a value of R and being a second DC voltage control source 124. The source of the FET 111 is connected to the receiver port 2.

An external capacitor 136 is connected to the antenna port 1 and one of the fourth set of parallel resistors 130. Another external capacitor 138 is connected to the receiver port 2 and to one of the sixth set of parallel resistors 134.

When the SPDT transmits high power to the antenna port 1, the receive section 114 is supposed to be OFF to provide high isolation to the receive port 2. In conventional circumstances, a high output power applied to the OFF FETs 109, 110, and 111 of the receive section 114 would turn some of the FETs back ON; however, with the addition of the external capacitors 126, 128, 136, and 138, the power handling capability of the SPDT switch of FIG. 6 is increased due to the main distortion mechanism of the SPDT.

More specifically, if the gate to drain voltage ($V_{GD}$) or the gate to source ($V_{GS}$) is greater than the pinch-off voltage $V_P$ of a FET, the FET will start to turn ON, which will cause RF power "bleeding" to ground through the receive port, therefore increasing harmonic distortion. However, in accordance with the concepts of the present invention, the distortion is greatly improved by adjusting the $V_{GD}$ and $V_{GS}$ of each individual OFF FET. This is accomplished in two steps.

First, the present invention uses multiple dual-gate FETs in series to emulate multi single-gate FETs, therefore the peak-to-peak voltage is significantly reduced. In the preferred embodiment of the present invention, three dual-gate FETs in series to emulate six single-gate FETs.

Secondly, the present invention adds capacitance between either the gate and drains or gates and sources of the FETs. One possible way of adding capacitance between either the gate and drains or gates and sources of the FETs is illustrated in FIG. 6. As illustrated in FIG. 6, external capacitors are added between the gates and drains and the gates and sources of the FETs to further reduce the peak-to-peak voltage.

Figure 7:
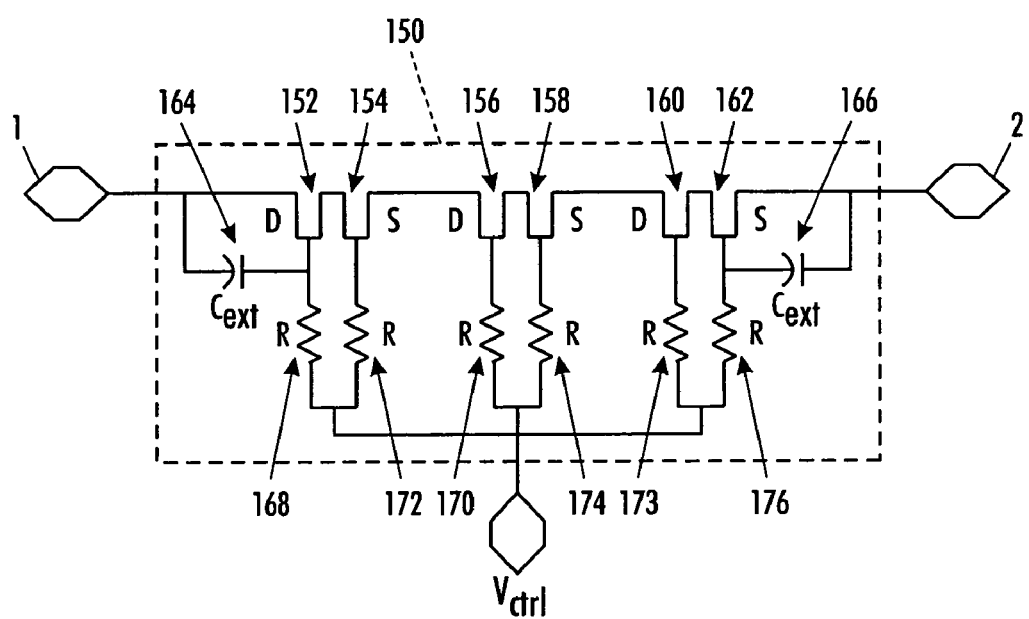
FIG. 7 illustrates an equivalent circuit for OFF FETs of FIG. 6.

FIG. 7 illustrates an equivalent circuit for the OFF FETs of FIG. 6 operating at a frequency of 900 MHz, 36 dBm of input power, and −1.0 pinch-off voltage. The three dual-gate OFF FETs are approximately the same, and each one is symmetrical from the drain to the source side. It is assumed that $C_{GDOFF}=C_{GSOFF}$ in this example. If the device were asymmetrical, these two values can be different. It is further noted that the external capacitors 164 and 166 are assumed to have equal capacitance, $C_{EXT}$.

For the OFF FETs, an equivalent circuit for a receive section 150 is provided, as shown in FIG. 7. The receive section 150 includes an antenna port 1 and a receiver port 2. The drain of a FET 152 is connected to the antenna port 1, and the gate of the FET 152 is connected to a resistor 168 having a resistance R. The resistor 168 is also connected to a DC voltage control source Vctrl. An external capacitor 164 is connected to the gate of the FET 152 and the antenna port 1. The source of the FET 152 is connected to the drain of a FET 154.

The gate of the FET 154 is connected to a resistor 172, and the source of the FET 154 is connected to the drain of a FET 156. The resistor 172 is also connected to the DC voltage control source Vctr1 and has a resistance of R. The gate of FET 156 is connected to a resistor 170, and its source is connected to the drain of a FET 158. The resistor 170 is also connected to the DC voltage control source Vctr1 and has a resistance of R. The gate of FET 158 is connected to a resistor 174, and the source of FET 158 is connected to the drain of a FET 160. The resistor 174 is also connected to the DC voltage control source Vctr1 and has a resistance of R. The gate of FET 160 is connected to a resistor 173, and the source is connected to the drain of a FET 162. The resistor 173 is also connected to the DC voltage control source Vctr1 and has a resistance of R. The gate of FET 162 is connected to a resistor 176, and the source is connected to drain of the receiver port 2. The resistor 176 is also connected to the DC voltage control source Vctr1 and has a resistance of R. An external capacitor 166 is connected to the gate of FET 162 and the receiver port 2.

Figure 8:
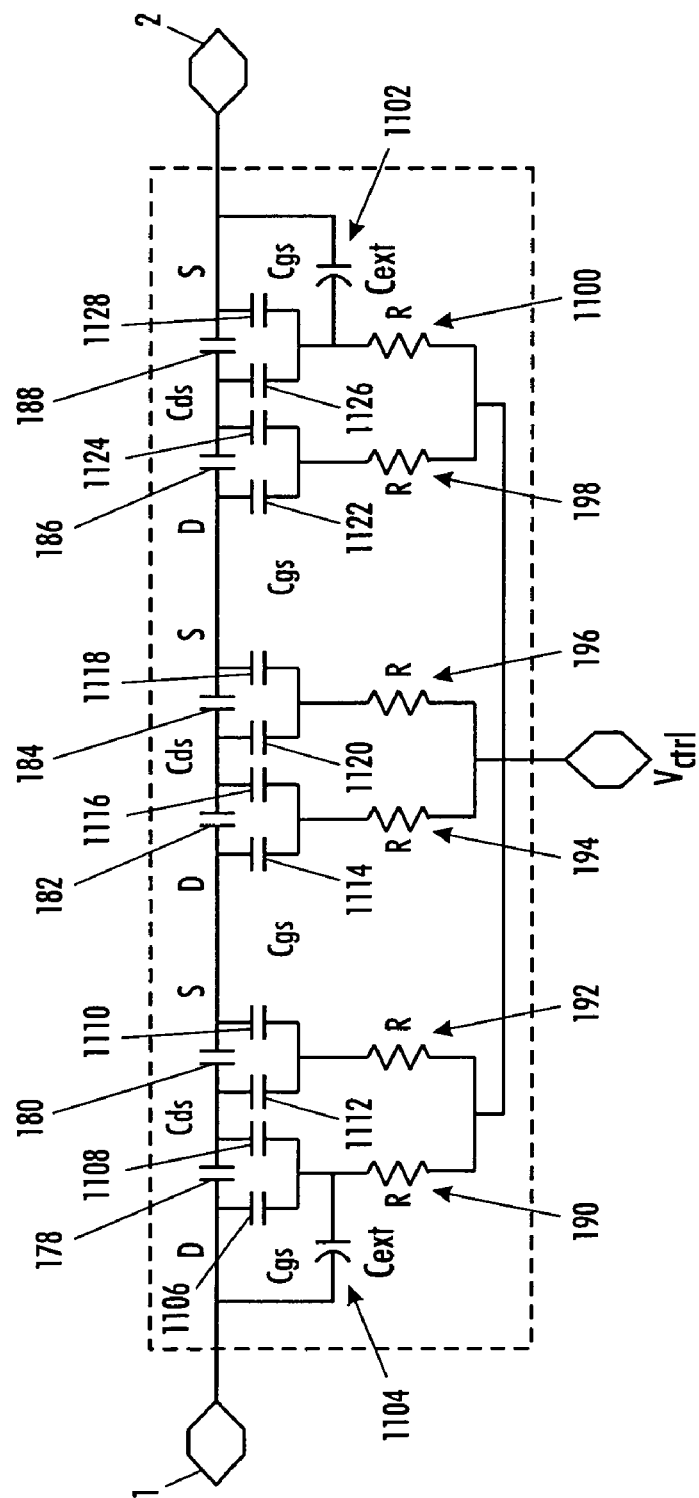
FIG. 8 illustrates an equivalent circuit for OFF FETs of FIG. 6 under small signal analysis.

FIG. 8 illustrates an equivalent circuit model for OFF FETs of FIG. 6 under small signal analysis. The receiver section 177 includes a receiver port 2, an antenna port 1, and a DC voltage control source Vctr1. In this arrangement, the FETs are modeled as capacitors, because in the small signal range most FETs possess large capacitive properties. Each FET is modeled to have two parallel gate-to-source capacitors ($C_{GS}$) and a drain-to-source capacitor ($C_{DS}$).

A drain-to-source capacitor 178 is associated with the FET 152 of FIG. 7, and is connected to the antenna port 1 and a drain to source capacitor 180 associated with the FET 154 of FIG. 7. The gate-to-source capacitors 1106 and 1108 are associated with FET 152 of FIG. 7. The first end of the gate-to-source capacitor 1106 is connected to the first end of the drain-to-source capacitor 178, and its second end is connected to the first end of a resistor 190 that has a resistance value R. The first end of the gate-to-source capacitor 1108 is connected to the second end of the capacitor 178, and its second end is connected to the first end of the resistor 190. The resistor 190 is also connected to a DC voltage control source Vctr1.

The second end of the drain-to-source capacitor 180 is connected to the first end of a drain-to-source capacitor 182 that is associated with the FET 156 of FIG. 7. Gate-to-source capacitors 1112 and 1110 are associated with the FET 154 of FIG. 7. The first end of the gate-to-source capacitor 1112 is connected to the first end of the drain-to-source capacitor 180, and its second end is connected to the first end of a resistor 192 having a resistance R. The first end of the gate-to-source capacitor 1110 is connected to the second end of the drain-to-source capacitor 180, and its second end is connected to the first end of the resistor 192. The second end of the resistor 192 is connected to the DC voltage control source Vctr1.

The second end of the drain-to-source capacitor 182 is connected to the first end of a drain-to-source capacitor 184 that is associated with the FET 158 of FIG. 7. Gate-to-source capacitors 1114 and 1116 are associated with the FET 156 of FIG. 7. The first end of the gate-to-source capacitor 1114 is connected to the first end of the drain-to-source capacitor 182, and its second end is connected to the first end of a resistor 194 having a resistance R. The first end of the gate-to-source capacitor 1116 is connected to the second end of the drain-to-source capacitor 182, and the second end of the gate-to-source capacitor 1116 is connected to the first end of the resistor 194. The second end of the resistor 194 is connected to the DC voltage control source Vctr1.

The second end of the drain-to-source capacitor 184 is connected to the first end of a drain-to-source capacitor 186 that is associated with the FET 160 of FIG. 7. Gate-to-source capacitors 1120 and 1118 are associated with the FET 158 of FIG. 7. The first end of the gate-to-source capacitor 1120 is connected to the first end of the drain-to-source capacitor 184, and its second end is connected to the first end of a resistor 196 having a resistance R. The first end of the gate-to-source capacitor 1118 is connected to the second end of the drain-to-source capacitor 184, and its second end is connected to the first end of the resistor 196. The second end of the resistor 196 is connected to the DC voltage control source Vctr1.

The second end of the drain-to-source capacitor 186 is connected to the first end of a drain-to-source capacitor 188 that is associated with the FET 162 of FIG. 7. Gate-to-source capacitors 1122 and 1124 are associated with the FET 160 of FIG. 7. The first end of the gate-to-source capacitor 1122 is connected to the first end of the drain-to-source capacitor 186, and its second end is connected to the first end of a resistor 198 having a resistance R. The first end of the gate-to-source capacitor 1124 is connected to the second end of the drain-to-source capacitor 186, and its second end is connected to the first end of the resistor 198. The second end of the resistor 198 is connected to the DC voltage control source Vctr1.

The second end of the drain-to-source capacitor 188 is connected to the receiver port 2. Gate-to-source capacitors 1126 and 1128 are associated with the FET 162 of FIG. 7. The first end of the gate-to-source capacitor 1126 is connected to the first end of the drain-to-source capacitor 188, and its second end is connected to the first end of a resistor 1100 having a resistance R. The first end of the gate-to-source capacitor 1128 is connected to the second end of the drain-to-source capacitor 188, and its second end is connected to the first end of the resistor 1100. The second end of the resistor 1100 is connected to the DC voltage control source Vctr1.

An external capacitor 1104 is connected to the antenna port 1 and to the resistor 190. Another external capacitor 1102 is connected to the receiver port 2 and resistor 1100.

As mentioned above, the three dual-gate OFF FETs are approximately the same, and each one is symmetrical from the drain to the source side. It is assumed that each FET is symmetrical from the drain to the source side in FIG. 7, the equivalent circuit for the OFF FETs of FIG. 6. Therefore, $C_{GDOFF}$ equals $C_{GSOFF}$ in this example. It is further noted that the external capacitors 164 and 166 are assumed to have equal capacitance, $C_{EXT}$.

The voltages of the gate to drain or gate to source in the FET 152, FET 154, FET 156, FET 158, FET 160 and FET 162, in FIG. 7, can be derived from the small signal equivalent circuit model in FIG. 8.

The $V_{GD}$ and $V_{GS}$ of the FET 152 are defined as:

$$V_{GD}=Vctr1-(((C_{GSOFF}/(12C_{GSOFF}+10C_{EXT}))*V_D \sin(2\pi f_0 t) \quad (11)$$

$$V_{GS}=Vctr1+((((C_{GSOFF}+C_{EXT})/(12C_{GSOFF}+10C_{EXT})) *V_D \sin(2\pi f_0 t) \quad (12)$$

where $f_0$ is the operational frequency, $C_{EXT}$ is the capacitance of the external capacitor 164, and $V_D$ is the voltage applied at the drain of FET 152.

The $V_{GD}$ and $V_{GS}$ of the FET 154 are defined as:

$$V_{GD}=Vctr1-((((C_{GSOFF}+C_{EXT})/(12C_{GSOFF}+10C_{EXT})) *V_D \sin(2\pi f_0 t) \quad (13)$$

$$V_{GS}=Vctr1+((((C_{GSOFF}+C_{EXT})/(12C_{GSOFF}+10C_{EXT})) *V_D \sin(2\pi f_0 t) \quad (14)$$

The $V_{GD}$ and $V_{GS}$ of the FET 156 are defined as:

$$V_{GD}=Vctr1-((((C_{GSOFF}+C_{EXT})/(12C_{GSOFF}+10C_{EXT})) \\ *V_D\sin(2\pi f_0 t)) \quad (15)$$

$$V_{GS}=Vctr1+((((C_{GSOFF}+C_{EXT})/(12C_{GSOFF}+10C_{EXT})) \\ *V_D\sin(2\pi f_0 t)) \quad (16)$$

The $V_{GD}$ and $V_{GS}$ of the FET 158 are defined as:

$$V_{GD}=Vctr1-((((C_{GSOFF}+C_{EXT})/(12C_{GSOFF}+10C_{EXT})) \\ *V_D\sin(2\pi f_0 t)) \quad (17)$$

$$V_{GS}=Vctr1+((((C_{GSOFF}+C_{EXT})/(12C_{GSOFF}+10C_{EXT})) \\ *V_D\sin(2\pi f_0 t)) \quad (18)$$

The $V_{GD}$ and $V_{GS}$ of the FET 160 are defined as:

$$V_{GD}=Vctr1-((((C_{GSOFF}+C_{EXT})/(12C_{GSOFF}+10C_{EXT})) \\ *V_D\sin(2\pi f_0 t)) \quad (19)$$

$$V_{GS}=Vctr1+((((C_{GSOFF}+C_{EXT})/(12C_{GSOFF}+10C_{EXT})) \\ *V_D\sin(2\pi f_0 t)) \quad (20)$$

The $V_{GD}$ and $V_{GS}$ of the FET 162 are defined as:

$$V_{GD}=Vctr1-((((C_{GSOFF}+C_{EXT})/(12C_{GSOFF}+10C_{EXT})) \\ *V_D\sin(2\pi f_0 t)) \quad (21)$$

$$V_{GS}=Vctr1+((((C_{GSOFF}+C_{EXT})/(12C_{GSOFF}+10C_{EXT})) \\ *V_D\sin(2\pi f_0 t)) \quad (22)$$

From Equations 11–22, the relationship between the capacitance of the external capacitors 164 and 166 and $V_{GD}$ of the FET 152 or $V_{GS}$ of FET 158 can be determined. By increasing the capacitance of the external capacitors 164 and 166, the RF peak-peak magnitude of the $V_{GD}$ of the FET 152 and the $V_{GS}$ of FET 158 is decreased. The circuit arrangement causes a behavior wherein during the first half cycle, the $V_{GD}$ and $V_{GS}$ of the FET 158 are less than the pinch-off voltage $V_P$, and during the second half cycle the $V_{GD}$ and $V_{GS}$ of the FET 152 are less than pinch-off voltage $V_P$. This enables that during the first half cycle the FET 158 is pinched off and during the second half cycle the FET 152 is pinched off; therefore, the receive path remains pinched off over the whole period.

These capacitors are used to keep the FETs in the OFF branch pinched-off, and improve the power handling capability and harmonic performance of the switch. Additional external capacitors (not shown) may be used to isolate the DC voltage used to control the switch from the rest of the system. These capacitors should be large enough to function as DC blocking capacitors.

Notwithstanding the improvements provide by the concepts of the present invention as illustrated in FIGS. 6–8 and described above, it is further desirable to realize this improvement without adding significant cost or complexity to the circuitry design. It is also desirable to improve the robustness of the switch to Electro-Static Discharge (ESD) or overstress phenomena such as Electrical Overstress (EOS).

To realize this desire, in a preferred embodiment of the present invention, as will be described in more detail below, provides a receiver branch design having at least one of the gate metals in the multi-gate FETs being fabricated with a gate size several times larger than the others. This modification of gate size reduces cost or complexity to the circuitry design while improving the harmonic distortion, power handling capability, and the insertion loss.

Moreover, in a further embodiment of the present invention, a heavily doped cap layer is utilized between the gate fingers in a multi-gate FET to reduce the channel resistance of FET, thereby further lowering the insertion loss.

Figure 9:
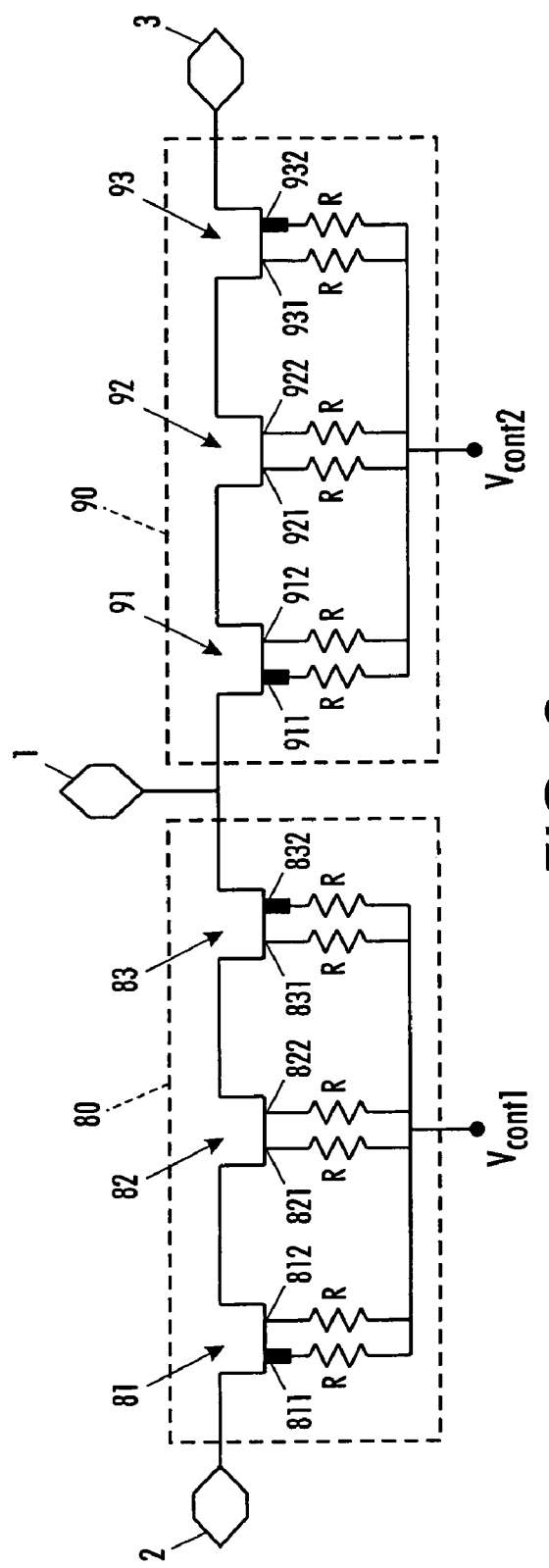
FIG. 9 is a schematic diagram of a three dual-gate FETs SPDT T/R switch with modified FET gate dimension according to the concepts of the present invention.

FIG. 9 illustrates an example of a dual-gate FET T/R switch with modified gate sizes to improve the switch linearity under a high power signal. As shown in FIG. 9, three dual-gate FETs 81, 82, and 83 of receiver section 80 are connected in series between an antenna port 1 and receiver port 2, and three dual-gate FETs 91, 92, and 93 of transmitter section 90 are connected in series between the antenna port 1 and transmitter port 3.

Furthermore, FIG. 9 illustrates that in the receiver section 80, the source of FET 81 is connected to the receiver port 2. Gates 811 and 812 of FET 81 are each connected to a resistor having a value R. The drain of FET 81 is connected to the source of FET 82. Gates 821 and 822 of FET 82 are each connected to a resistor having a value R. The drain of FET 82 is connected to the source of FET 83. Gates 831 and 832 of FET 83 are each connected to a resistor having a value R. The drain of FET 83 is connected to the antenna port 1.

Also, FIG. 9 illustrates that in the transmitter section 90, the source of FET 93 is connected to the transmitter port 3. Gates 931 and 932 of FET 93 are each connected to a resistor having a value R. The drain of FET 93 is connected to the source of FET 92. Gates 921 and 922 of FET 92 are each connected to a resistor having a value R. The drain of FET 92 is connected to the source of FET 91. Gates 911 and 912 of FET 91 are each connected to a resistor having a value R. The drain of FET 91 is connected to the antenna port 1.

It is noted that, in the example illustrated by FIG. 9, the gates 811, 832, 911, and 932 have lengths longer than the lengths of gates 812, 821, 822, 831, 912, 921, 922, and 931. In this embodiment each gate has been connected to a resistor with the same value, R. In other embodiments it might be desirable to have different values for each gate.

Figure 10:
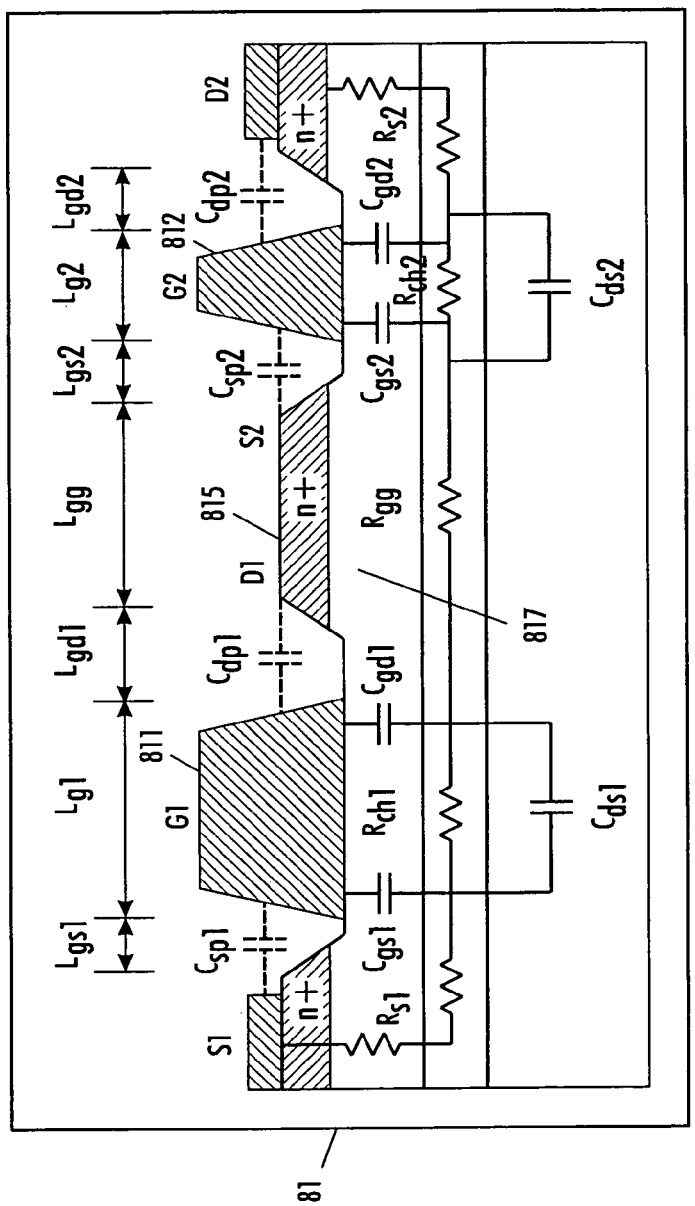
FIG. 10 is a schematic diagram of the cross-section view of one dual-gate FET structure of FIG. 9 having a modified FET gate dimension according to the concepts of the present invention.
Figure 11:
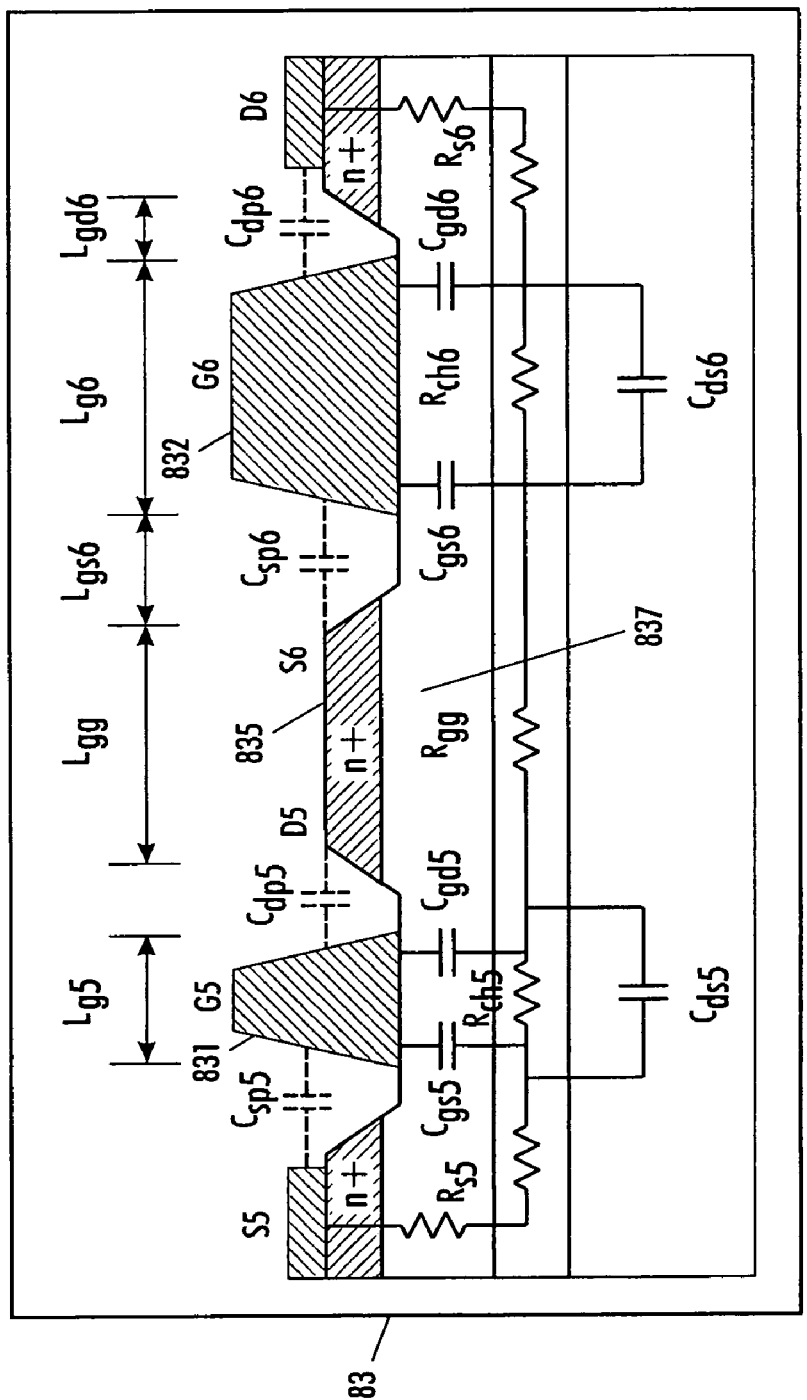
FIG. 11 is a schematic diagram of the cross-section view of another dual-gate FET structure of FIG. 9 having a modified FET gate dimension according to the concepts of the present invention.
Figure 12:
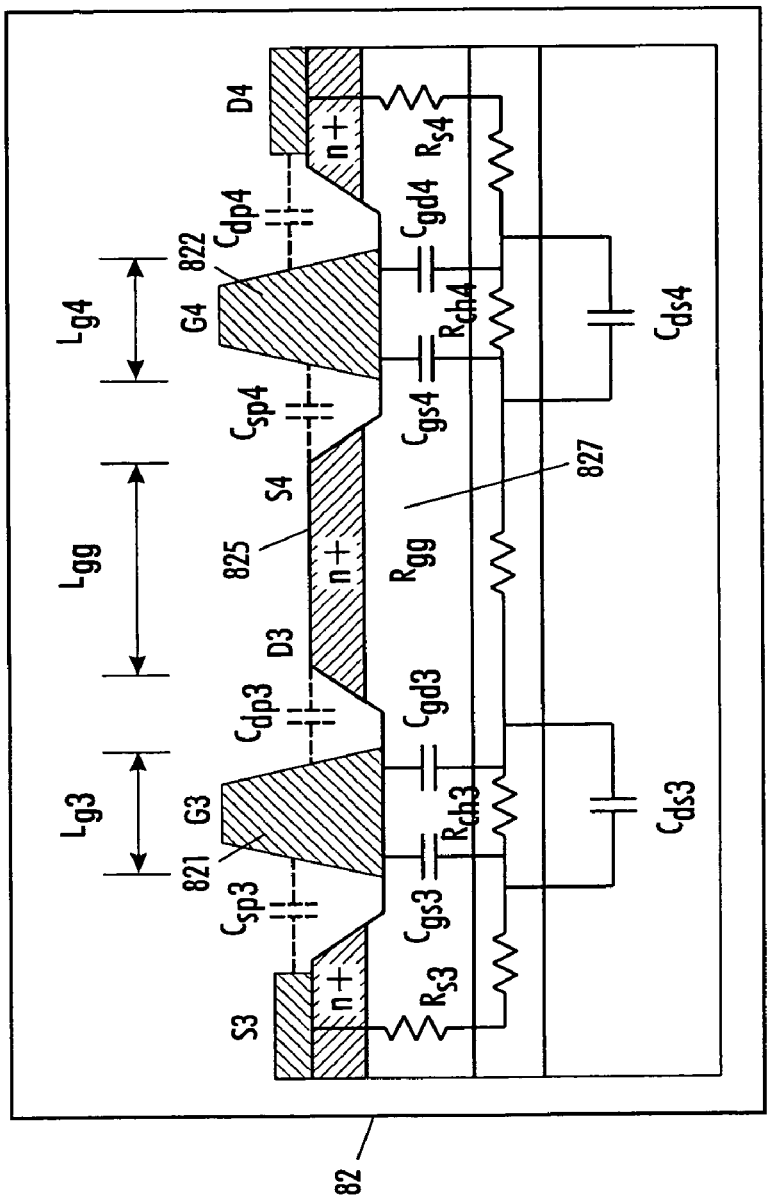
FIG. 12 is a schematic diagram of the cross-section view of a third dual-gate FET structure of FIG. 9 having a conventional FET gate dimension according to the concepts of the present invention.

To more clearly show the dimensional differences between the various gates, the cross-sections of transistors 81, 82, and 83, as shown in FIGS. 10, 12, and 11, respectively, have been illustrated.

More specifically, as illustrated in FIG. 10, the FET 81 includes two gates 811 and 812. As illustrated, the length, $L_{G1}$, of gate 811 is longer than the length, $L_{G2}$, of gate 812. It is further noted that FET 81 includes a heavily doped cap 815 located between gates 811 and 812. In the preferred embodiment, this cap 815 is heavily n-doped. As noted above, the heavily doped cap 815 reduces the channel resistance of FET, thereby further lowering the insertion loss.

As illustrated in FIG. 11, the FET 83 includes two gates 831 and 832. As illustrated, the length, $L_{G6}$, of gate 832 is longer than the length, $L_{G5}$, of gate 831. It is further noted that FET 83 includes a heavily doped cap 835 located between gates 831 and 832. In the preferred embodiment, this cap 835 is heavily n-doped. As noted above, the heavily doped cap 835 reduces the channel resistance of FET, thereby further lowering the insertion loss.

As illustrated in FIG. 12, the FET 82 includes two gates 821 and 822. As illustrated, the length, $L_{G4}$, of gate 842 is equal to the length, $L_{G3}$, of gate 821. It is further noted that FET 82 includes a heavily doped cap 825 located between gates 821 and 822. In the preferred embodiment, this cap 825 is heavily n-doped. As noted above, the heavily doped cap 825 reduces the channel resistance of FET, thereby further lowering the insertion loss.

Figure 13:
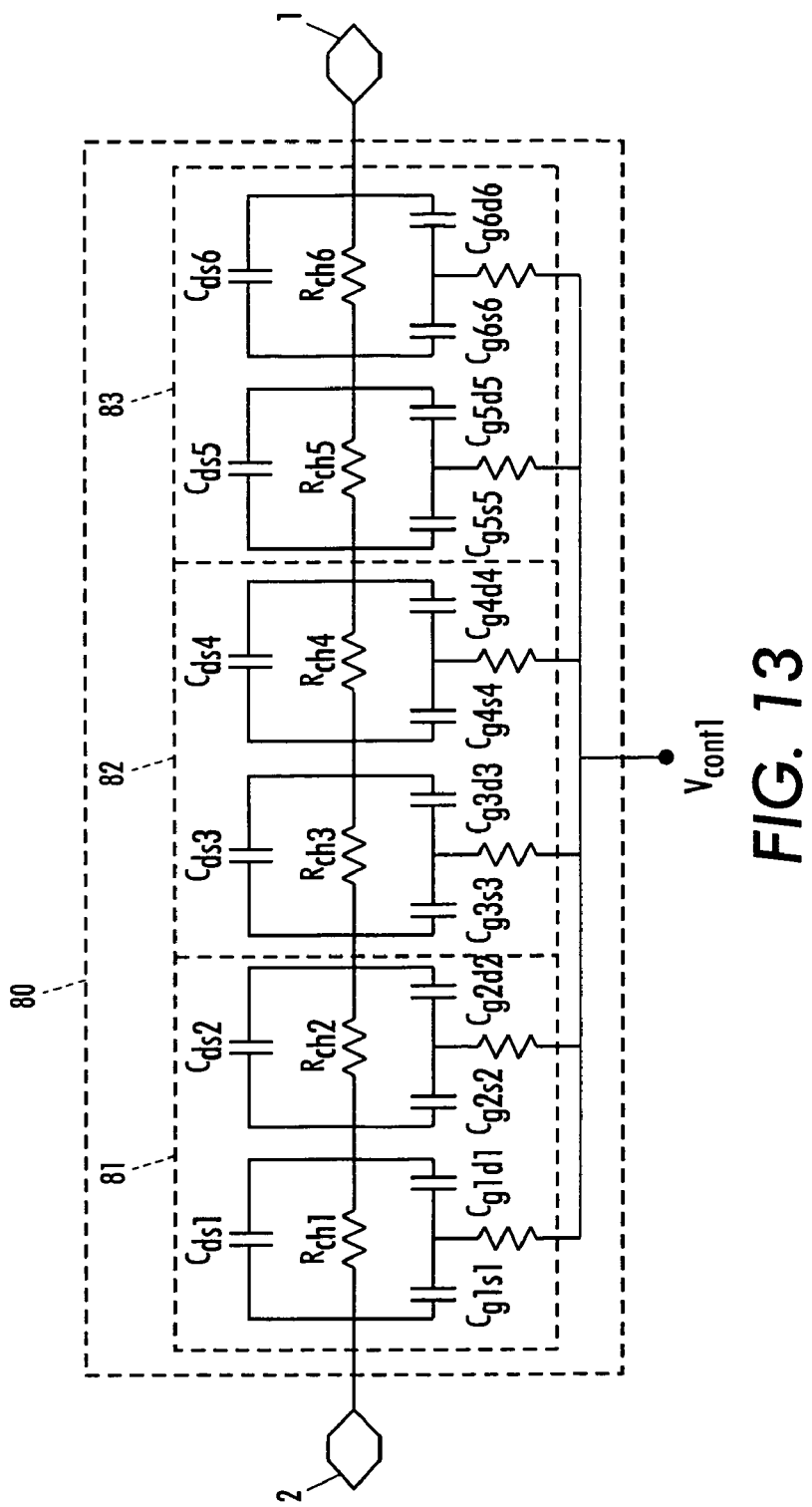
FIG. 13 is a diagram of a small signal equivalent circuit for the OFF-state three dual-gate FET structures of FIG. 9.

To explain the advantages of the various embodiments illustrated in FIGS. 9–12, a small signal equivalent circuit model of the receiver section 80 (Off-state FETs 81, 82, and 83) is shown in FIG. 13. Since there is an extremely large channel resistance $R_{ch}$ in each transistor 81, 82, and 83 in the OFF state, the small signal model in FIG. 13 can be further simplified, as shown in FIG. 14.

Figure 14:
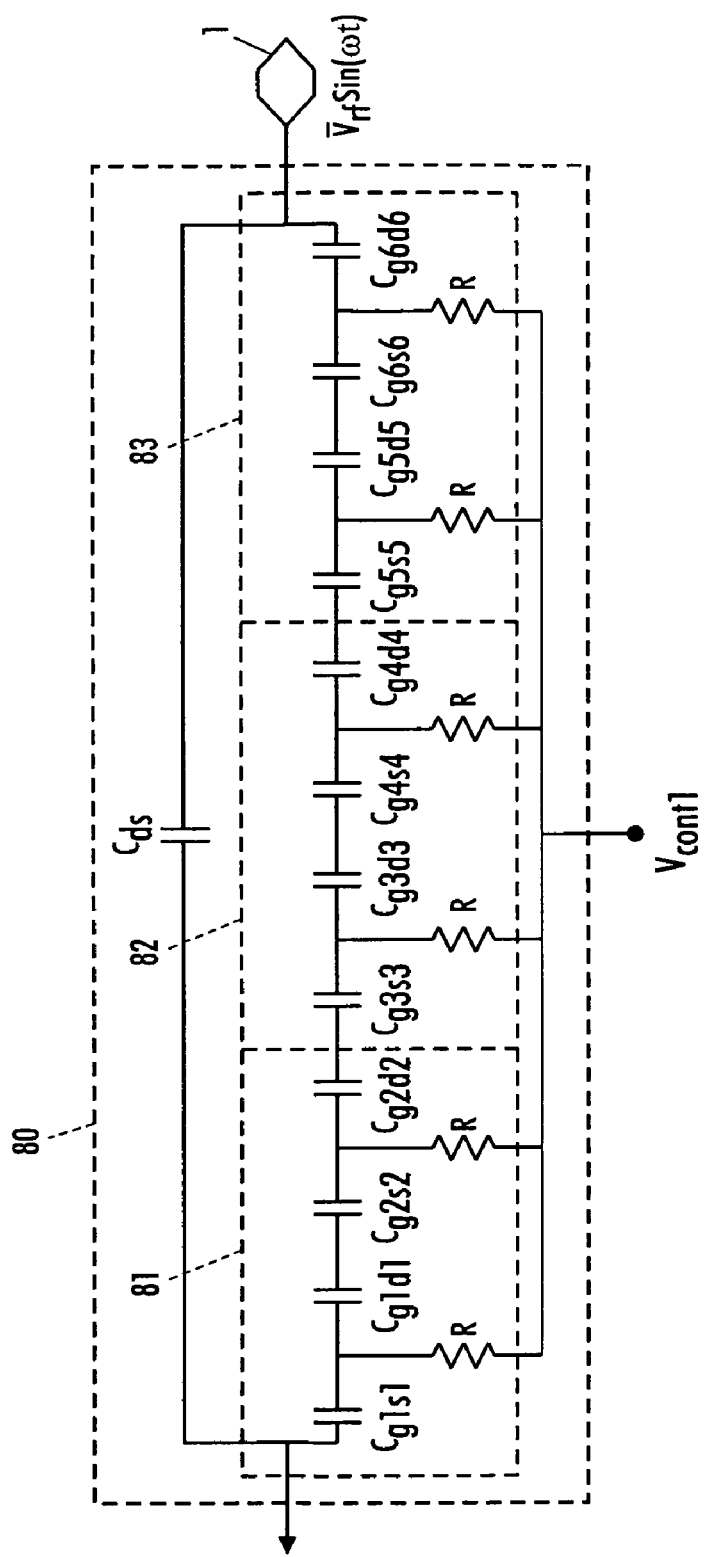
FIG. 14 is a diagram of the simplified small signal equivalent circuit extracted from FIG. 13.

As illustrated in both FIGS. 13 and 14, the control voltage is applied to each gate through an extremely large resistor R that prevents the RF signal from bleeding to the DC control voltage source Vcont1. Thus, the voltage at the gate port is expected to be the same as $V_{cont1}$ at the resistor end.

Similar to the analysis of a single FET switch, the voltage drop in each FET junction can be expressed as a function of capacitance and control voltage. In the explanation below, it is assumed that all FETs with smaller gate sizes are designed symmetrically and have the same gate length. It is further is assumed that $C_{GISI} = C_{GIDI}$ (where I=2 to 5), where $C_{GISI} = C_{GSI} + C_{SPI}$ and $C_{GIDI} = C_{GDI} + C_{DPI}$. $C_{DPI}$ and $C_{SPI}$ are fringing parasite capacitances that are the function of distance between gate metal to drain and source metals, respectively, as demonstrated in FIG. 10.

For gate 811 of FET 81, as illustrated in FIG. 10, and gate 832 of FET 83, as illustrated in FIG. 11, $C_{G1S1} = C_{G6D6}$ and $C_{G1D1} = C_{G6S6}$ due to the mirror-like layout.

For simplification, let $C_{GISI} = C_{GIDI} = C_{OFF}$ (where I=3, 4); $C_{GISI} = C_{GIDI} = C_{OFF}$ (where I=2, 5); $C_{G1S1} = C_{G6D6} = C_{OFF1}$, and $C_{G1D1} = C_{G6S6} = C_{OFF2}$. Then, the voltage drops for long gate 811 of FET 81 are as follows:

$$V_{G1S1} = V_{cont1} - V_{cont2} + (1/((4C_{OFF1}/C_{OFF}) + (4C_{OFF1}/C_{OFF}) + (2C_{OFF1}/C_{OFF2}) + 2))*v \quad (23)$$

$$V_{G1D1} = V_{cont1} - V_{cont2} - (1/((4C_{OFF2}/C_{OFF}) + (4C_{OFF2}/C_{OFF}) + (2C_{OFF2}/C_{OFF1}) + 2))*v \quad (24)$$

The voltage drops for short gate 812 of FET 81 are as follows:

$$V_{G2S2} = V_{cont1} - V_{cont2} + (1/((4C_{OFF}/C_{OFF}) + (2C_{OFF}/C_{OFF1}) + (2C_{OFF}/C_{OFF2}) + 4))*v \quad (25)$$

$$V_{G2D2} = V_{cont1} - V_{cont2} - (1/((4C_{OFF}/C_{OFF}) + (2C_{OFF}/C_{OFF1}) + (2C_{OFF}/C_{OFF2}) + 4))*v \quad (26)$$

The voltage drops for gates 821 and 822 of FET 82 can be easily derived similar to Equation (25) and (26) because of the same FET layout. More specifically, $V_{G3S3}$ is equal to $V_{G4S4}$, and $V_{G3D3}$ is equal to $V_{G4D4}$ as shown below:

$$V_{G3S3} = V_{cont1} - V_{cont2} + (1/((4C_{OFF}/C_{OFF}) + (2C_{OFF}/C_{OFF1}) + (2C_{OFF}/C_{OFF2}) + 4))*v \quad (27)$$

$$V_{G3D3} = V_{cont1} - V_{cont2} - (1/((4C_{OFF}/C_{OFF}) + (2C_{OFF}/C_{OFF1}) + (2C_{OFF}/C_{OFF2}) + 4))*v \quad (28)$$

In a preferred embodiment, the layout of gate 831 of FET 83 (FIG. 11) is the same as gate 812 in FET 81 (FIG. 10). Thus, $V_{G5S5}$ is equal to $V_{G2S2}$, as in Equation (25), and $V_{G5D5}$ is equal to $V_{G2D2}$, as in Equation (26). Moreover, in a preferred embodiment, gate 832 of FET 83 (FIG. 11) has a mirror-like layout to gate 811 of FET 81 (FIG. 10). Thus, the Equations of $V_{G6S6}$ and $V_{G6D6}$ are as follows:

$$V_{G6S6} = V_{cont1} - V_{cont2} + (1/((4C_{OFF2}/C_{OFF}) + (4C_{OFF2}/C_{OFF}) + (2C_{OFF2}/C_{OFF1}) + 2))*v \quad (29)$$

$$V_{G6D6} = V_{cont1} - V_{cont2} - (1/((4C_{OFF1}/C_{OFF}) + (4C_{OFF1}/C_{OFF}) + (2C_{OFF1}/C_{OFF2}) + 2))*v \quad (30)$$

The operational status of each FET depends on the gate-source voltage $V_{GS}$ (or gate-drain voltage $V_{GD}$) and pinch-off voltage $V_P$. As long as either $V_{GS}$ or $V_{GD}$ is less then $V_P$; i.e., ($V_{GS}$ or $V_{GD}$)<$V_P$; the FET is in the OFF state.

To suppress harmonic distortion and enhance power handling in a T/R switch, the leakage of the RF signal from receiver branch to ground must be minimized while the high power RF signal is transmitted to the antenna. This implies that at least one of the FETs in the receiver branch must remain in the OFF state.

Before explaining the switch mechanism of the present invention, the correlation between the parasitic capacitances $C_{OFF}$, $C_{OFF}$, $C_{OFF1}$, and $C_{OFF2}$ will be discussed based on the transistor physical models as illustrated in FIGS. 10–12.

When the epitaxy of a FET structure is fixed, the parasitic parameters in the FET equivalent circuit model are directly related to the FET geometric sizes, such as gate length $L_G$, gate width $W_G$, space between gate and source port $L_{GS}$, and the space between gate and drain port $L_{GD}$, etc. Normally, the intrinsic capacitances $C_{GS}$ and $C_{GD}$ are dependent on the gate size, for example:

$$C_{GS} = W_G L_G C_{OX} F_1(V_{DS}) \quad (31)$$

$$C_{GD} = W_G L_G C_{OX} F_2(V_{DS}) \quad (32)$$

where $C_{OX}$ is the capacitance associated with the FET epitaxial structure, and $F_1(V_{DS})$ and $F_2(V_{DS})$ are special functions varying with drain-source voltage. When the FET is OFF, both $F_1$ and $F_2$ are constant.

It can be seen from the above Equations that the longer the gate length, the larger $C_{GS}$ and $C_{GD}$. Assuming that gate length is N times greater than a standard gate length (normally 0.5 micron), $C_{GS}$ and $C_{GD}$ are increased about the same amount, theoretically.

In reality, when a FET operates in a deep OFF state, these intrinsic capacitances are not only proportional to the gate length, but are also, to some degree, reversely proportional to the distance between the gate metal to the drain or source port, $L_{GS}$ and $L_{GD}$, respectively. Consequently, $C_{GS}$ and $C_{GD}$ decrease with an increase in $L_{GS}$ and $L_{GD}$. The reason is due to the high resistivity depletion area extending beyond the gate area towards the drain and source electrodes with more negative FET junction biases. This emulates an increase in the distance between the two metal plates in a parallel-plate capacitor, leading to the decrease in capacitance.

In FIG. 10, it is seen that there are some extrinsic capacitances, $C_{SP1}$, $C_{SP2}$, $C_{DP1}$, and $C_{DP2}$, generated between the electrodes, in addition to the intrinsic capacitances. This kind of capacitor is called a fringing capacitor, and it behaves like a parallel-plate capacitor. In other words, this capacitance is inversely proportional to the distance between the gate and drain or source port.

As with the intrinsic capacitors, the fringing capacitance also increases with the gate width. For the insertion loss of the switch, the large $L_{G1}$ results in a larger channel resistance $R_{CH1}$ in the ON-state FET 81, as indicated in Equation (10) above.

To compensate for this drawback, a longer gate width is designed since $R_{ON}$ is inversely proportional to the gate width. Increasing gate width leads to an increase in intrinsic capacitance, $C_{GS}$ and $C_{GD}$, and fringing capacitance, $C_{SP}$ and $C_{DP}$.

Looking at the equivalent circuit models of FIGS. 10 and 11, $C_{OFF1} = C_{G1S1} = C_{GS1} + C_{SP1}$; $C_{OFF2} = C_{G1D1} = C_{GD1} + C_{DP1}$; and $C_{OFF} = C_{G2S2} = C_{GS2} + C_{SP2}$. In FIG. 12, $C_{OFF}$ can be calculated as $C_{OFF} = C_{G3S3} = C_{GS3} + C_{SP3}$. In a symmetrically designed FET, it is reasonable to let $C_{SP} = C_{DP}$.

Assuming that $L_{G1}$ and $L_{G6}$ is N times greater than $L_{G2}$ (or $L_{G3}$ ... ), and $W_G$ of FET 81 (FIG. 10) and FET 83 (FIG. 11) is N' times longer than $W_G$ of FET 82 (FIG. 12), the correlations among $C_{OFF1}$, $C_{OFF2}$, $C_{OFF}$, and $C_{OFF}$ are approximately expressed as:

$$(C_{OFF1}/C_{OFF}) = (NNC_{GS2} + C_{SP1})/(C_{GS2} + C_{SP2}) \quad (33)$$

$$(C_{OFF1}/C_{OFF}) = (N'NC_{GS3}+C_{SP1})/(C_{GS3}+C_{SP3}) \quad (34)$$

$$(C_{OFF1}/C_{OFF2}) = (C_{GS1}+C_{SP1})/(C_{GD1}+C_{DP1}) \quad (35)$$

given that $L_{GS1} < L_{GS2} = L_{GS3} < L_{GD1}$, $C_{SP1} > C_{SP2} = NC_{SP3}$ and $C_{SP2} > C_{DP1}$; consequently, $C_{OFF1}/C_{OFF} > C_{OFF1}/C_{OFF} > N^*N'$, and $C_{OFF1}/C_{OFF2} > 1$.

It is noted that the increase in gate width impacts another parasitic capacitor, $C_{DS}$. $C_{DS}$ in the OFF-state FET plays a role in the isolation performance, a benefit of a SPDT switch. This isolation performance determines how much RF energy leaks from the antenna port to the OFF port, or vice versa. Normally, increasing $C_{DS}$ deteriorates isolation of the OFF-state FET. However, the present invention utilization of the longer gate length compensates for the increase in $C_{DS}$ because the physical distance between drain and source is extended. Therefore, the resulting $C_{DS}$ basically remains the same as that of FET with normal gate length and gate width.

In Equations (23) and (30), the third item is much less than $v/(8N^*N'+4)$, while the third items in the other FET junctions, such as $V_{G3S3}$ (Equation 27) and $V_{G3D3}$ (Equation 28) is about $v/(8+4/N^*N')$. In the case of three dual-gate FETs in series without modification of gate size, the third item is $1/12v$. This implies that the fluctuation of voltage drop of the junction G1S1 and G6D6 due to the transmitted RF signal is dramatically reduced compared with those of other junctions.

As long as this fluctuation is less than $|V_{cont1}-V_{cont2}-V_P|$, this FET remains OFF. For example, let $N=N'=2$, and assuming $V_{cont1}-V_{cont2}=-2.6$ V (self-biasing due to the gate current causes the DC voltage drop to be less than the difference in control voltages, $-3V$), the junction voltages can be simulated according to Equations (23) to (30).

Figure 15:
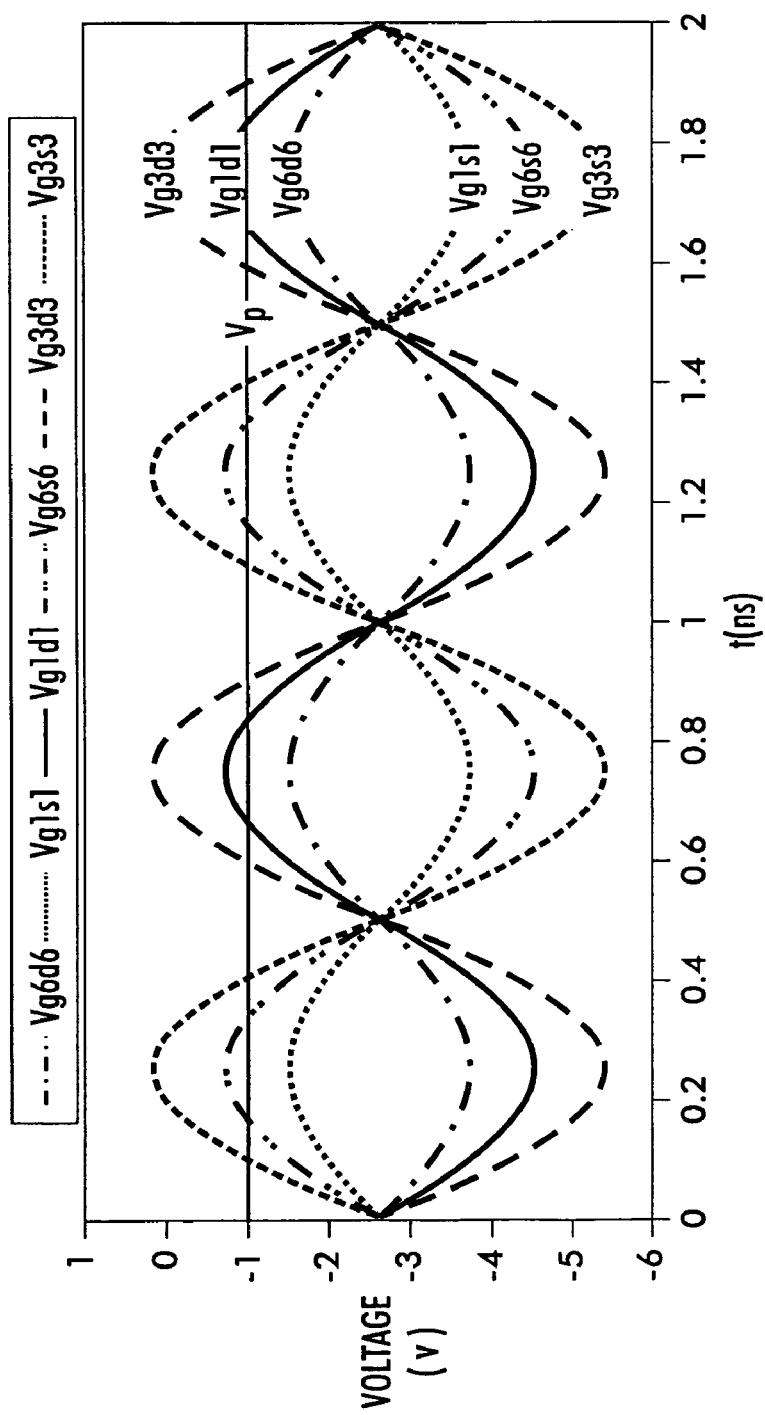
FIG. 15 is a diagram of simulated $V_{GS}$ and $V_{GD}$ as function of time for FET with longer gate length and FET with normal gate size in a three dual-gate FETs in series SPDT T/R switch.

Given that $P_{rfmax}=37$ dBm, $V_P=-1V$, $\omega=2\pi f_0=1$ GHz, FIG. 15 illustrates examples of voltage swings in the FET junctions vs. time. As illustrated by FIG. 15, during the first half period of the RF signal v, $V_{G1S1}$ changes from deep negative to shallow negative, but remains below $V_P$, while $V_{G1D1}$ becomes more negative. Thus, FET 81 of FIG. 9 remains in the OFF state while FET 83 of FIG. 9 and FET 82 of FIG. 9 turn ON for some time period due to the junction voltage exceeding $V_P$ Similarly, as further illustrated in FIG. 15, during the second half period of the RF signal v, $V_{G6D6}$ and $V_{G6S6}$ remain below $V_P$ so that FET 83 of FIG. 9 stays in the OFF state while FET 82 of FIG. 9 and FET 81 of FIG. 9 turn ON.

The results indicate that at least one of the FETs in the receiver branch 80 of FIG. 9 remains in the OFF state for the full RF cycle, thus, preventing power leakage from the receiver branch 80 of FIG. 9 and significantly improving the harmonic distortion. The power handling capability is enhanced as well due to the better isolation.

As mentioned above, the present invention provides a n+ cap layer (815, 825, and 835) on top of the transistor connection area (817, 827, and 837), as shown in FIGS. 10, 11, and 12 to reduce the ON-state resistance between the two gate metals when utilizing HEMT switches.

With respect to the conventional dual-gate HEMT, as illustrated in FIG. 16, the area 930 between the gate fingers 910 and 920 is exposed. Consequently, the surface potential, $V_{SURFACE}$, can easily deplete the non-doped exposed layer 970, resulting in a decrease in the electrical carrier density and an increase in resistance $R_{gg}$, in this segment.

Normally, the total resistance in an ON-state dual-gate FET can be written as:

$$R_{tot}=2R_s+2R_{ch}+R_{gg} \quad (36)$$

In this situation, high $R_{gg}$ causes a high $R_{tot}$, thereby, leading to high insertion loss.

In a conventional HEMT structure, $R_s$ is about 0.12 Ωmm, $R_{ch}$ is about 1.2 Ωmm for a 0.5 μm gate length in an ON state transistor, and $R_{gg}$ is about 0.7 Ωmm when the non-doped layer 970 is exposed. The theoretical effect of $R_{gg}$ on the insertion loss in an SPDT switch can be calculated as follows.

Assuming a gate width of 1 mm, three dual-gate HEMTs in series create an ON state resistance $R_{ON}$ of about 6.1 Ω According to Equation (9), the insertion loss is about 0.52 dB.

With the modified layout according to the concepts of the present invention as illustrated in FIGS. 10–12, the heavily doped cap layer (815, 825, and 835 as shown in FIGS. 10, 11, and 12, respectively) screens any surface potential change, which helps to minimize the channel resistance in this segment. In this case, $R_{gg}$ is about 0.25 Ωmm.

Thus, $R_{ON}$ is estimated as 4.7 Ω, i.e., 0.4 dB insertion loss; indicating that the application of the cap layer (815, 825, and 835 as shown in FIGS. 10, 11, and 12, respectively) on top of the connection area dramatically improves the insertion loss.

In summary, the present invention provides a SPDT T/R switch, which is composed of a plurality of dual-gate metal-semiconductor field-effect transistors (MESFETs) or dual-gate HEMTs connected in series and coupled to a receiver port and an antenna port and a plurality of dual-gate MESFETs or HEMTs connected in series and coupled to a transmitter port and an antenna port. The two gate metals in two of the FETs, respectively, are fabricated with a gate size several times larger than the others. One of the large sized gates is positioned closer to source (or drain) port than to drain (or source). The second large sized gate is positioned in the opposite way, closer to drain (or source) than to source (or drain) port.

The longer gate size is realized by making the gate length N times longer than the others and by increasing the gate width. The increased gate size results in larger parasitic capacitances between the gate to its surrounding metals, such as source port and drain port. The reduced space between the gate to neighbor metals leads to further increases in the parasitic capacitance while the series resistance is reduced. Therefore, the distribution of RF signal on each OFF-state FET in the receiver branch is modified and is different from the traditional switch where the RF signal is uniformly distributed across all OFF-state FETs The voltage swing in the junction of the large gate size FET is significantly reduced so that the OFF state is maintained. Thus, the modifications in the FET design enhance the power handling capability and reduce the creation of harmonic distortion.

Also, according to the concepts of in the present invention, a dual-gate FET SPDT switch with modified gate sizes, parasitic capacitance, exhibits low distortion and high power handling capability without the need for additional circuitry. The cap layer modifications to the HEMT design results in the reduction of HEMT SPDT switch insertion loss. Additionally, by designing in parasitic capacitance and eliminating the need for external capacitors, the present invention greatly improves the resilience to electrostatic discharge (ESD), which can cause catastrophic damage.

The circuit configurations of the present invention, as presented above, provide a low insertion loss, high linear output power, and low harmonic distortion SPDT. It is also noted that the concepts set forth above can be extended to include additional branches and ports. That is, the present invention could be constructed in like manner that has two or more receive branches and ports, and/or two or more transmit branches and ports.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A switch comprising:
   a plurality of dual-gate field effect transistors connected in series, each dual-gate field effect transistor including two gates, a source, and a drain;
   one of said series connected dual-gate field effect transistors having a modified gate therein, said modified gate having a length that is of a different size from gate lengths of other series connected dual-gate field effect transistors.

2. The switch as claimed in claim 1, wherein said modified gate of said series connected dual-gate field effect transistor has a distance to its drain port that is less than a distance to its source port.

3. The switch as claimed in claim 1, wherein said modified gate of said series connected dual-gate field effect transistor has a distance to its source port that is less than a distance to its drain port.

4. The switch as claimed in claim 2, wherein gates of said other series connected dual-gate field effect transistors have a distance to its source port that is equal to a distance to its drain port.

5. The switch as claimed in claim 3, wherein gates of said other series connected dual-gate field effect transistors have a distance to its source port that is equal to a distance to its drain port.

6. The switch as claimed in claim 1, wherein a second series connected dual-gate field effect transistor has a modified gate therein that is of a different size from gates of other series connected dual-gate field effect transistors.

7. The switch as claimed in claim 1, wherein said dual-gate field effect transistors are high-electron-mobility-transistors.

8. The switch as claimed in claim 1, wherein the different gate sizes increase a parasitic capacitance within the switch.

9. A switch comprising:
   a plurality of dual-gate field effect transistors connected in series, each dual-gate field effect transistor including two gates, a source, and a drain;
   one of said series connected dual-gate field effect transistors having a modified gate therein that is of a different size from gates of other series connected dual-gate field effect transistors;
   said dual-gate field effect transistors include a transistor connection segment between said gates and a heavily doped cap layer fabricated upon said transistor connection segment between said gates.

10. A high-electron-mobility-transistor, comprising:
    two gate fingers;
    a transistor connection segment between said gate fingers; and
    a heavily doped cap layer fabricated upon said transistor connection segment between said gate fingers;
    said gate fingers being of different sizes.

11. The high-electron-mobility-transistor as claimed in claim 10, wherein one of said gate fingers has a distance to its source port that is less than a distance to its drain port.

12. The high-electron-mobility-transistor as claimed in claim 10, wherein one of said gate fingers has a distance to its drain port that is less than a distance to its source port.

13. A radio frequency single pole double throw switch, comprising:
    a receiver port;
    a transmitter port;
    an antenna port;
    a receiver section connecting said receiver port to said antenna; and
    a transmitter section connecting said transmitter port to said antenna;
    said receiver section including a plurality of dual-gate field effect transistors connected in series, each dual-gate field effect transistor including two gates, a source, and a drain such that one of said series connected dual-gate field effect transistors has a modified gate therein, said modified gate having a length that is of a different size from gate lengths of other series connected dual-gate field effect transistors.

14. The radio frequency single pole double throw switch as claimed in claim 13, wherein a source of said modified gate transistor is connected to said receiver port.

15. The radio frequency single pole double throw switch as claimed in claim 13, wherein a drain of said modified gate transistor is connected to said antenna port.

16. The radio frequency single pole double throw switch as claimed in claim 13, wherein a second series connected dual-gate field effect transistor has a second modified gate therein that is of a different size from gates of other series connected dual-gate field effect transistors.

17. The radio frequency single pole double throw switch as claimed in claim 16, wherein a source of said modified gate transistor is connected to said receiver port and a drain of said second modified gate transistor is connected to said antenna port.

18. The radio frequency single pole double throw switch as claimed in claim 13, wherein said dual-gate field effect transistors are high-electron-mobility-transistors.

19. The radio frequency single pole double throw switch as claimed in claim 13, wherein said modified gate of said series connected dual-gate field effect transistor has a longer gate length and/or gate width than gates of said other series connected dual-gate field effect transistor.

20. The radio frequency single pole double throw switch as claimed in claim 13, wherein said modified gate of said series connected dual-gate field effect transistor has a distance to its drain port that is less than a distance to its source port.

21. The radio frequency single pole double throw switch as claimed in claim 13, wherein said modified gate of said series connected dual-gate field effect transistor has a distance to its source port that is less than a distance to its drain port.

22. The radio frequency single pole double throw switch as claimed in claim 20, wherein gates of said other series connected dual-gate field effect transistors have a distance to its source port that is equal to a distance to its drain port.

23. The radio frequency single pole double throw switch as claimed in claim 21, wherein gates of said other series connected dual-gate field effect transistors have a distance to its source port that is equal to a distance to its drain port.

24. The radio frequency single pole double throw switch as claimed in claim 13, wherein the different gate sizes increase a parasitic capacitance within the switch.

25. A radio frequency single pole double throw switch comprising:

a receiver port;
a transmitter port;
an antenna port;
a receiver section connecting said receiver port to said antenna; and
a transmitter section connecting said transmitter port to said antenna;
said receiver section including a plurality of dual-gate field effect transistors connected in series, each dual-gate field effect transistor including two gates, a source, and a drain such that one of said series connected dual-gate field effect transistors has a modified gate therein that is of a different size from gates of other series connected dual-gate field effect transistors;
said dual-gate field effect transistors include a transistor connection segment between said gates and a heavily doped cap layer fabricated upon said transistor connection segment between said gates.

26. A radio frequency single pole double throw switch comprising:
a receiver port;
a transmitter port;
an antenna port;
a receiver section connecting said receiver port to said antenna; and
a transmitter section connecting said transmitter port to said antenna;
said receiver section including,
   a first receiver dual-gate high electron mobility transistor having gates of different lengths, and
   a second receiver dual-gate high electron mobility transistor having gates of different lengths;
said transmitter section including a first transmitter dual-gate high electron mobility transistor having gates of different lengths and a second transmitter dual-gate high electron mobility transistor having gates of different lengths;
said first transmitter dual-gate high electron mobility transistor having a source, said source being connected to said receiver port and the drain of said second transmitter dual-gate high electron mobility transistor is connected to said antenna port.

27. The radio frequency single pole double throw switch as claimed in claim 26, wherein said transmitter section includes a first transmitter dual-gate high electron mobility transistor having gates of different lengths and a second transmitter dual-gate high electron mobility transistor having gates of different lengths.

28. The radio frequency single pole double throw switch as claimed in claim 26, wherein a first gate of said first receiver dual-gate high electron mobility transistor has a longer gate length and/or gate width than a second gate of said first receiver dual-gate high electron mobility transistor.

29. The radio frequency single pole double throw switch as claimed in claim 26, wherein a first gate of said first receiver dual-gate high electron mobility transistor has a distance to its drain port that is less than a distance to its source port.

30. The radio frequency single pole double throw switch as claimed in claim 26, wherein a first gate of said second receiver dual-gate high electron mobility transistor has a distance to its source port that is less than a distance to its drain port.

31. The radio frequency single pole double throw switch as claimed in claim 26, wherein the different gate lengths increase a parasitic capacitance within the switch.

32. The radio frequency single pole double throw switch claimed in claim 26, wherein the different gate lengths improve the linearity without impacting the ESD and EOS ruggedness.

* * * * *